United States Patent
Shen et al.

(10) Patent No.: US 6,207,584 B1
(45) Date of Patent: Mar. 27, 2001

(54) HIGH DIELECTRIC CONSTANT MATERIAL DEPOSITION TO ACHIEVE HIGH CAPACITANCE

(75) Inventors: Hua Shen, Beacon, NY (US); David E. Kotecki, Orono, ME (US); Robert Laibowitz, Peekskill, NY (US); Katherine Lynn Saenger, Ossining, NY (US); Satish D. Athavale, Fishkill, NY (US); Jenny Lian, Wallkill, NY (US); Martin Gutsche, Dorfen (DE); Yun-Yu Wang, Poughquag; Thomas Shaw, Peekskill, both of NY (US)

(73) Assignees: International Business Machines Corp., Armonk, NY (US); Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/478,270

(22) Filed: Jan. 5, 2000

(51) Int. Cl.⁷ ..................................................... H01L 21/31
(52) U.S. Cl. ............................ 438/762; 438/763; 438/785
(58) Field of Search ............................ 438/762, 785, 438/763, 964, 255, 398, 933, 238

(56) References Cited

U.S. PATENT DOCUMENTS

| | | | |
|---|---|---|---|
| 5,102,832 | * | 4/1992 | Tuttle .................................. 437/231 |
| 5,494,840 | * | 2/1996 | Ohmi ..................................... 437/52 |
| 5,569,619 | * | 10/1996 | Roh ....................................... 437/52 |
| 5,728,604 | * | 3/1998 | Rha et al. .............................. 438/41 |
| 5,754,390 | * | 5/1998 | Sandhu et al. .................... 361/321.4 |
| 5,783,253 | * | 7/1998 | Roh ....................................... 427/81 |
| 5,843,829 | * | 12/1998 | Kuramae et al. .................... 438/396 |
| 5,962,069 | * | 10/1999 | Schindler et al. ................... 427/226 |
| 5,976,931 | * | 11/1999 | Yew et al. ............................ 438/255 |
| 5,976,990 | * | 11/1999 | Mercaldi et al. .................... 438/762 |
| 6,033,943 | * | 3/2000 | Gardner ............................... 438/199 |

* cited by examiner

Primary Examiner—Matthew Smith
Assistant Examiner—V. Yevsikov
(74) Attorney, Agent, or Firm—Stanton Braden

(57) ABSTRACT

A method for forming a dielectric layer includes exposing a surface to a first dielectric material in gaseous form at a first temperature. Nuclei of the first dielectric material are formed on the surface. A layer of a second dielectric material is deposited on the surface by employing the nuclei as seeds for layer growth wherein the depositing is performed at a second temperature which is greater than the first temperature.

31 Claims, 5 Drawing Sheets

HIGH DIELECTRIC CONSTANT MATERIAL DEPOSITION TO ACHIEVE HIGH CAPACITANCE

BACKGROUND

1. Technical Field

This disclosure relates to semiconductor fabrication and more particularly, to high dielectric constant layers with improved dielectric characteristics provided by employing a nucleation method prior to formation of the high dielectric constant layer.

2. Description of the Related Art

The art of semiconductor fabrication is driven by the desire to continually shrink device sizes and improve component capabilities. These goals are often contradictory. While decreasing sizes of devices provides a more efficient layout, component features such as dielectric films or layers are pushed to their limit. Often, materials or processes used to form these dielectric films or layers become inadequate for future chip generations. Deposition processes and dielectric materials are usually reduced in size along with the shrinking device dimensions. This often requires the reduced size dielectric material to electrically isolate components with at least the same capacity as earlier generations.

In other cases, improved dielectric layers not only provide less thickness or layout area but may also improve performance. For example, capacitor dielectric layers for stacked capacitors for dynamic random access memories (DRAM) include a high dielectric constant layer between two electrodes. Improvements in the dielectric layer between the electrodes provide a more reliable device and increase capacitance.

Referring to FIG. 1, major elements of a semiconductor memory cell are illustratively shown. Stacked capacitors 10 are shown having a top electrode 16, a bottom electrode 18 and a capacitor dielectric layer 20 therebetween. Bottom electrode 18 is provided on a dielectric layer 19 and is connected to a plug 22 which extends down to a portion of active area 12. Active areas 12 form an access transistor for charging and discharging stack capacitor 10 in accordance with data on a bitline 24. Bitline 24 is coupled to a portion of active area 12 (source or drain of the access transistor) by a contact 23. When a gate conductor 28 is activated the access transistor conducts and charges or discharges stack capacitor 10. When the minimum feature size is reduced with each new generation of the memory design, stacked capacitor 12 loses area thereby reducing the capacitor's capabilities. Capacitor dielectric layer 20 may formed from a high dielectric constant material to increase capacitance. Barium strontium titanium oxide (BSTO) is typically employed.

BSTO may be deposited by physical vapor deposition (PVD), chemical vapor deposition (CVD) or other processes. CVD is preferred to get high step coverage around the bottom electrode. In a one step CVD process, BSTO films are deposited at a constant temperature for a given time by controlling, primarily, the deposition pressure and BSTO composition. In a two step (or multi-step) deposition process, a first step is to deposit a continuous BSTO film at a lower temperature to obtain an amorphous film. A second step is employed to deposit another continuous BSTO film at a higher temperature to obtain a crystallized BSTO film. An anneal step is needed to crystallize the first layer of the amorphous BSTO film either before or after depositing the second BSTO film. Although BSTO provides a high dielectric constant layer between capacitor electrodes, it would be advantageous to increase the capabilities of the dielectric layer between the two capacitor electrodes to improve performance and reduce possible leakage.

Therefore, a need exists for a method for improving the dielectric characteristics of a deposited dielectric layer. A further need exists for a dielectric layer which has improved dielectric characteristic without cost to layout area and without increase to the thickness of the dielectric layer.

SUMMARY OF THE INVENTION

A method for forming a dielectric layer, in accordance with the present invention, includes exposing a surface to a first dielectric material in gaseous form at a first temperature. Nuclei of the first dielectric material are formed on the surface. A layer of a second dielectric material is deposited on the surface by employing the nuclei as seeds for layer growth wherein the depositing is performed at a second temperature which is greater than the first temperature.

A method for forming a capacitor dielectric layer, in accordance wit the invention, includes forming a first capacitor electrode and exposing a surface of the first capacitor electrode to a first dielectric material in gaseous form at a first temperature. Nuclei are formed of the first dielectric material on the surface of the first capacitor electrode. A layer of a second dielectric material is deposited on the surface by employing the nuclei as seeds for layer growth wherein the depositing is performed at a second temperature which is greater than the first temperature.

In other methods, the first dielectric material may includes one of a metal oxide and a metal titanate, and the second dielectric material may also include one of a metal oxide and a metal titanate. The first temperature may be less than about 500 degrees Celsius, and the second temperature may be greater than about 550 degrees Celsius. The step of forming nuclei of the first dielectric material may include exposing the surface to the first dielectric material for between about 2 to about 30 seconds. The step of forming a second capacitor electrode over the second dielectric layer to form a capacitor may be included. The capacitor may provide 50 fF to about 500 fF per square micron of electrode area. The first dielectric material and the second dielectric material may be the same. The first dielectric material and the second dielectric material may include barium strontium titanium oxide. The method may further include the step of preparing the first capacitor electrode by etching a surface of the first capacitor electrode.

A method for forming a stacked capacitor for a semiconductor memory device, in accordance with the present invention includes forming a first capacitor electrode, exposing a surface of the first capacitor electrode to barium strontium titanium oxide (BSTO) in gaseous form at a first temperature, and forming nuclei of the BSTO on the surface of the first capacitor electrode by adjusting at least one of gas composition, flow rate and pressure of the BSTO to provide a grain size and orientation of the nuclei. A dielectric layer is deposited on the surface by employing the nuclei as seeds for layer growth wherein the depositing is performed at a second temperature which is greater than the first temperature.

In other methods, the first temperature may be between about 350 degrees and about 500 degrees Celsius, and the second temperature may be greater than about 550 degrees Celsius. The step of forming nuclei of the BSTO may include exposing the surface to the BSTO for less than about 100 seconds. The method may include the step of forming a second capacitor electrode over the dielectric layer to form a capacitor. The capacitor may provide 50 fF to about 500 fF per square micron of electrode area. The dielectric layer may include one of a metal oxide and a metal titanate. The step of annealing the dielectric layer may also be included.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor fabrication processes and more particularly, to high dielectric constant layers with improved dielectric characteristics provided by employing a nucleation method prior to formation of the high dielectric constant layer. The capacitance of the high dielectric constant materials is controlled by one or more of film composition, grain orientation, grain size, interface layer, deposition temperature and pressure, and choice of precursors. This invention presents a deposition process which is able to increase the capacitance of high dielectric constant materials (for example, BSTO) by controlling the nucleation process and therefore altering the grain orientation and size to increase the capacitance.

Figure 2:
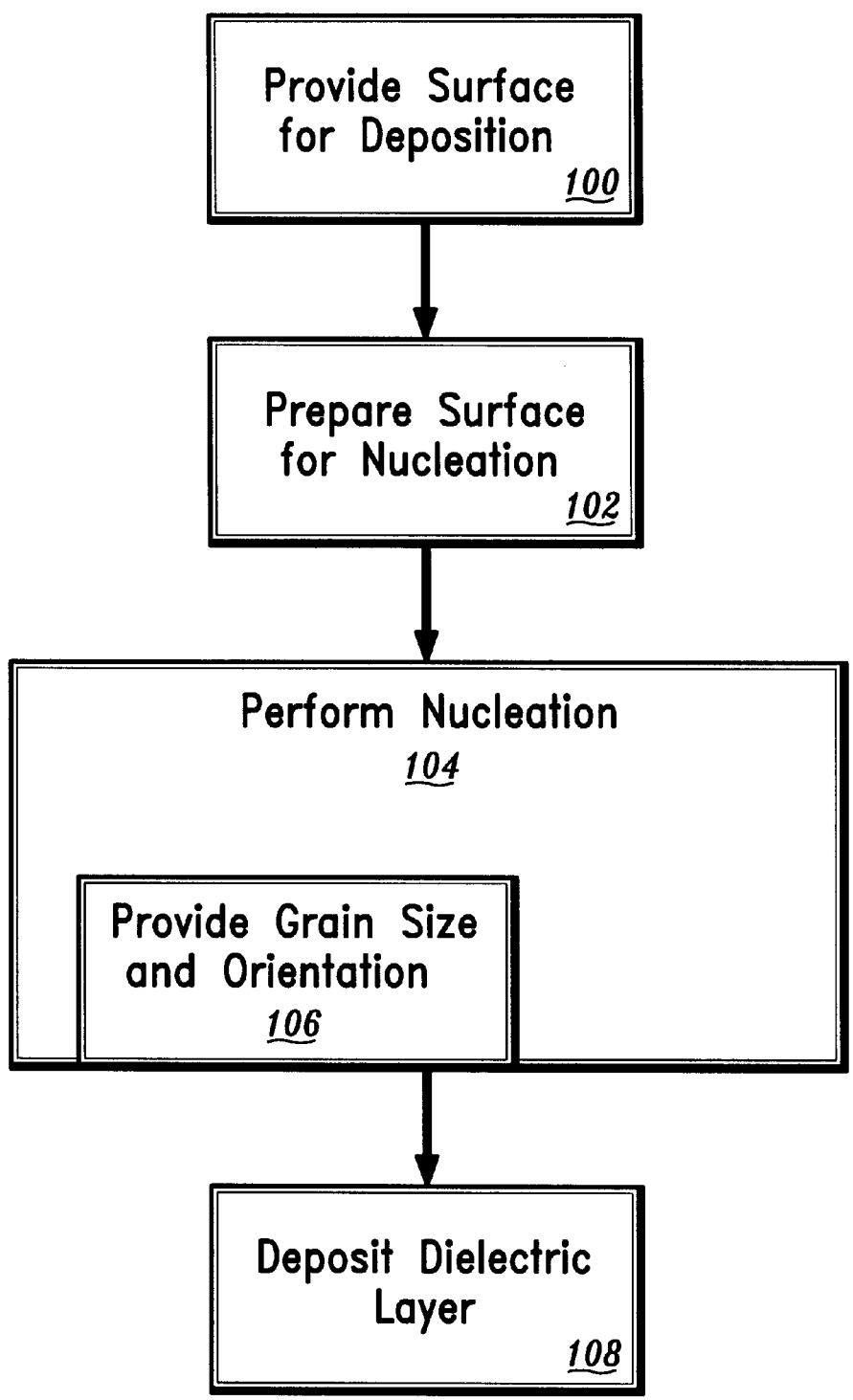
FIG. 2 is a flow chart of a method for forming a dielectric layer in accordance with the present invention.

Referring now in specific detail to the drawings in which like reference numerals identify similar or identical elements throughout the several views, and initially to FIG. 2, a flow chart for the present invention shows a new deposition method, which can be employed for high dielectric constant materials. The deposition method is illustratively described in terms of BSTO, however other materials are contemplated, for example lead zirconium titanium (PZT), lead lanthanum zirconium titanium (PLZT), titanium oxide ($TiO_2$), barium titanium oxide (BTO), strontium titanium oxide (STO), bismuth zirconium titanium oxide (BZTO), strontium bismuth titanate (SBT), metal oxides, doped oxides and other perovskite dielectrics. High dielectric materials may include materials with a dielectric constant of greater than about 7 although the present invention may be employed with any dielectric layer or material.

In block 100, a surface is provided for deposition of the high dielectric constant material. The surface may include a metal, a dielectric layer, a semiconductor materials or other suitable surface. In a preferred embodiment, the surface includes a material having a crystallographic structure amenable to the nucleation of the high dielectric constant material to be deposited. Alternately, the surface may be prepared for the nucleation of the high dielectric constant material. In block 102, an optional preparation step is performed. The preparation step may include cleaning the surface with a an etchant to expose a substantially defect free surface. The etchant employed depends on the surface composition. If a metal surface is employed an acid etch may be used to prepare the surface. Preparation can also include heating the substrate to a higher temperature than the deposition temperature for a short time (e.g., a few seconds) before the start of nucleation or exposing the surface to an oxygen containing gas such as $O_2$, $N_2O$, $CO$ or $CO_2$ at about room temperature or an elevated temperature prior to nucleation.

In block 104, a high dielectric constant material nucleation step is performed. In one embodiment, the surface is exposed to BSTO deposition gas for a very short time, for example, between about 3 seconds to about 20 seconds at a different temperature from a deposition temperature, the BSTO nucleation will occur. The density and orientation of the BSTO nuclei depend on the exposure time and temperature. Other factors include BSTO gas composition, flow rate and pressure. In a preferred embodiment, a temperature of between less than about 500 degrees Celsius, and more preferably between about 350 degrees Celsius to about 500 degrees Celsius is employed when the deposition temperature for BSTO is greater than about 550 degrees Celsius, preferably between about 550 and about 700 degrees Celsius.

In block 106, a preferred grain orientation and grain size may be achieved for the dielectric material by controlling the exposure time and temperature and other parameters. For example, by depositing BSTO on a metal surface for less than about 100 seconds at less than about 500 degrees Celsius, the grains are orientated in accordance with the present invention.

In block 108, a BSTO (or other high dielectric constant material) deposition step is performed. After the nucleation step, a dielectric layer of the same material as the nucleation step (or other dielectric material) is deposited. Since there are already nuclei on the surface, the layer will grow from the existing nuclei and the final grain orientation and size will largely depend on the initial BSTO nuclei. The dielectric may be deposited by employing a chemical vapor deposition process. The temperature of deposition is preferably between about 550 and about 700 degrees C for BSTO. Other processes may also be used for the deposition process since the nuclei have been formed previously in block 104.

Figure 3:
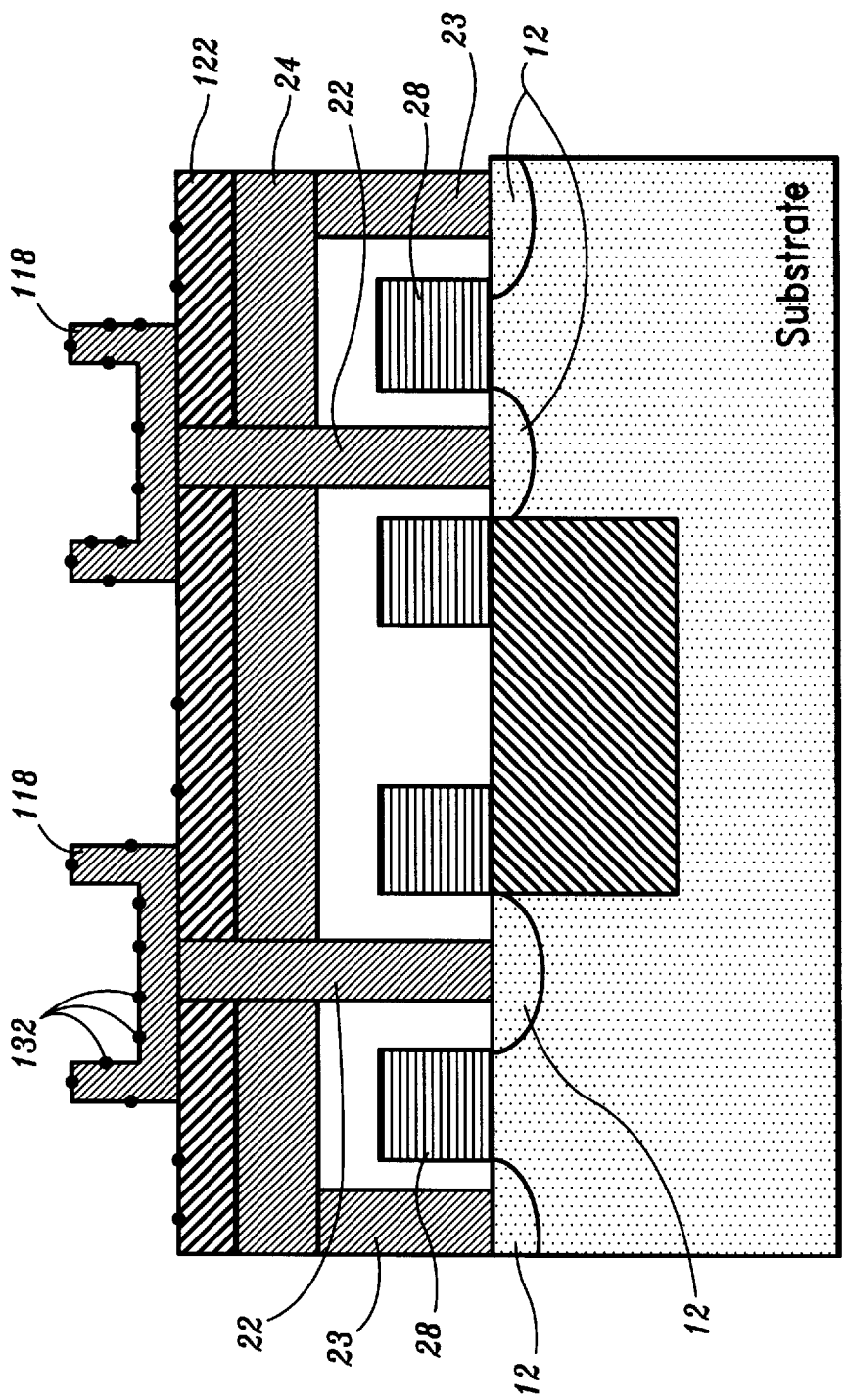
FIG. 3 is a cross-sectional view of a stacked capacitor with a bottom electrode exposed for nucleation of the dielectric layer in accordance with the present invention.
Figure 4:
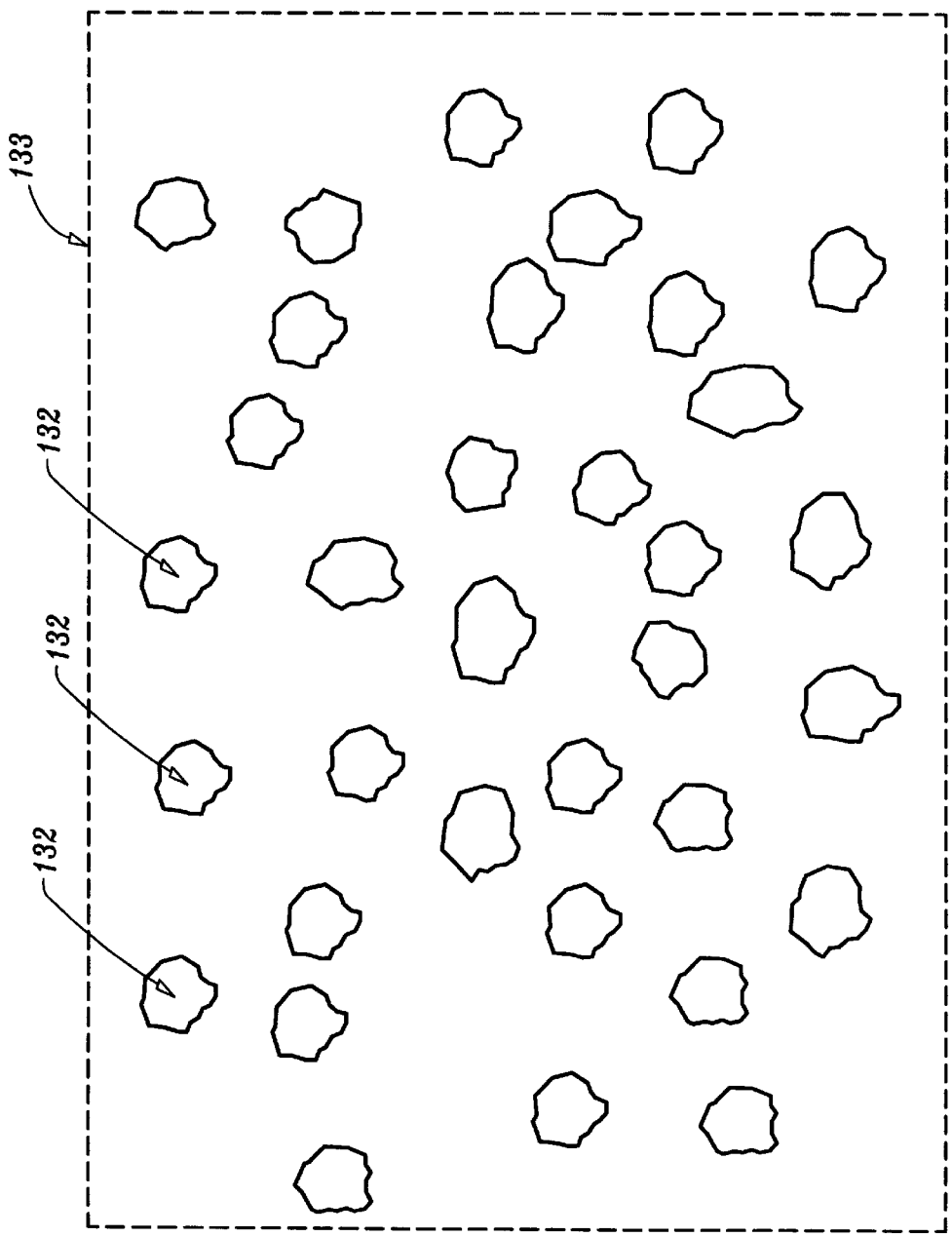
FIG. 4 is a magnified top view of a surface on which nucleation is occurring in accordance with the present invention.

Referring to FIG. 3, the present invention provides a dielectric material with improved dielectric characteristics. In one embodiment, BSTO is nucleated and deposited on a lower electrode 118 and on a dielectric layer 122. Lower electrode 118 and dielectric layer 122 may be prepared for BSTO nucleation as described above. As shown in FIG. 4, nucleation begins on a surface 133 (i.e., bottom electrode 118) at nucleation sites. During a short duration at a temperature lower than the deposition temperature of BSTO, condensation or nucleation occurs which creates small nuclei 132. These nuclei 132 grow into small grains when several atoms or molecules accumulate. The nuclei act as seeds for growth of the high dielectric constant layer deposition which follows.

Figure 1:
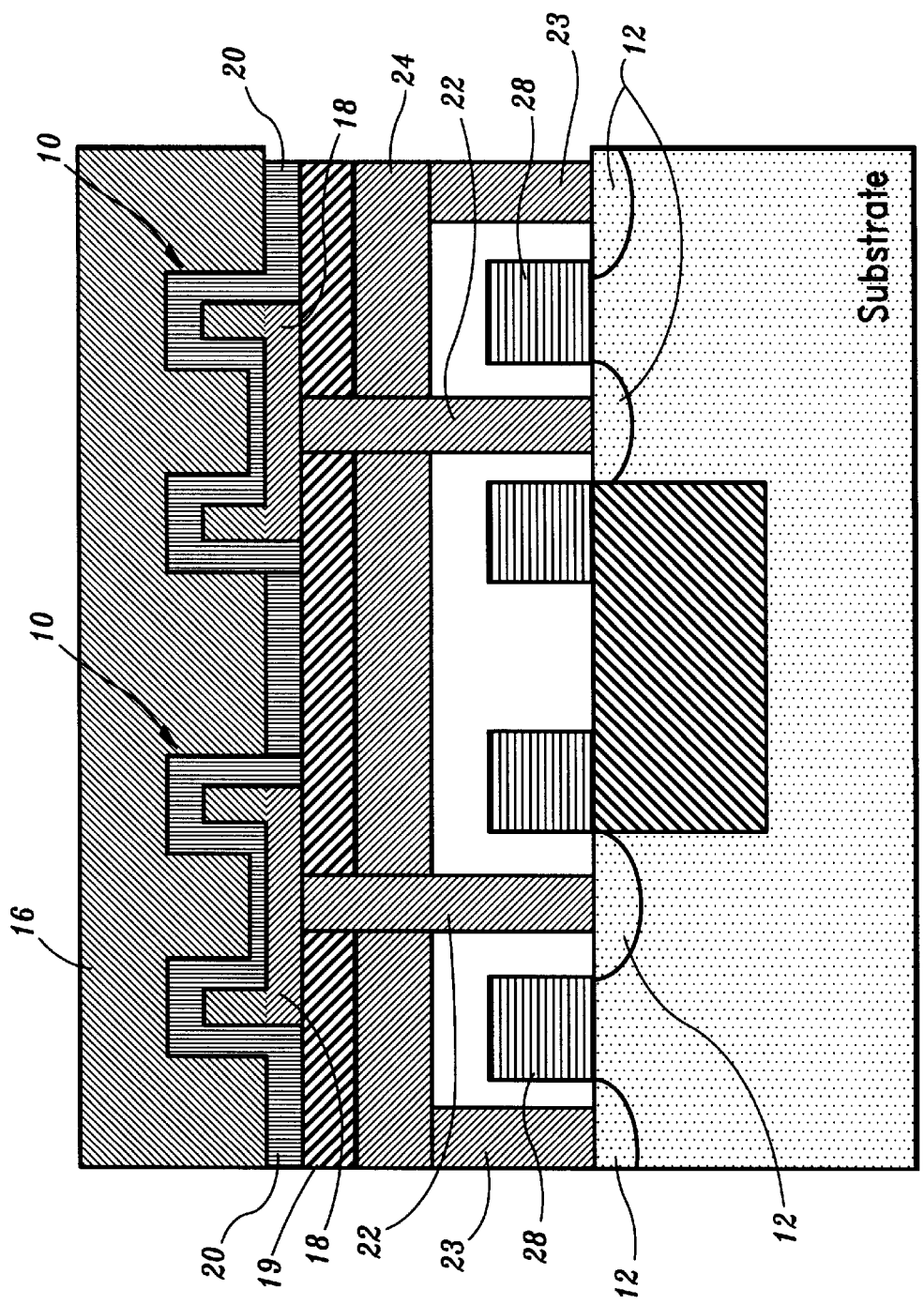
FIG. 1 is a cross-sectional view of a conventional stacked capacitor structure.
Figure 5:
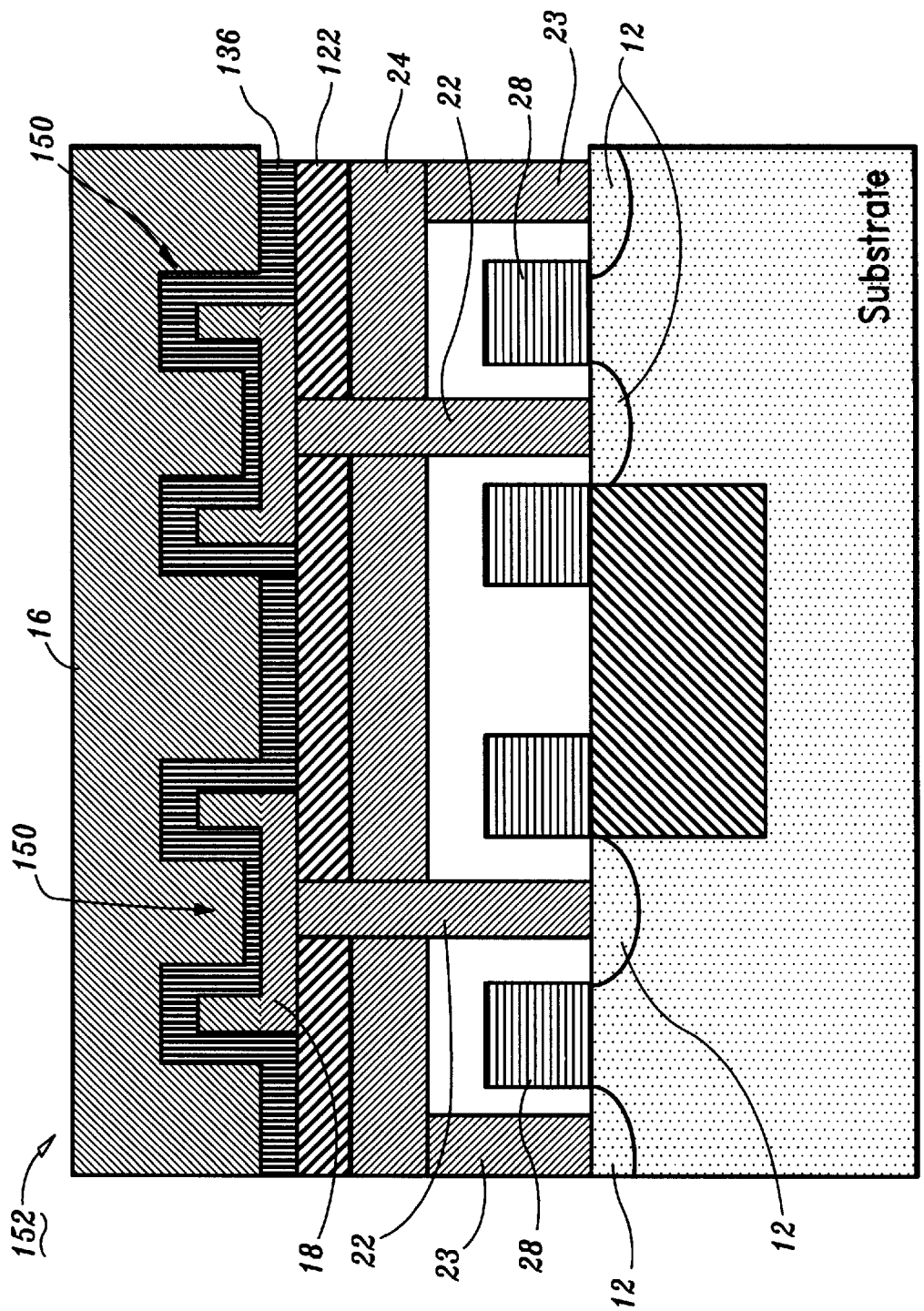
FIG. 5 is a cross-sectional view of a stacked capacitor with a top electrode formed after deposition of the dielectric layer in accordance with the present invention.

Referring to FIG. 5, the deposition process forms a layer of BSTO 136 over lower electrodes 118 and dielectric layer 122. Layer 136 may be between about 5 and about 30 nm in thickness. The BSTO is substantially crystalline since it is grown from nuclei 132 at a temperature of between about 550 and about 700 degrees Celsius. The BSTO may also be annealed in an inert environment (e.g., in Ar, $N_2$ or $O_2$) to increase crystallinity. In accordance with this embodiment of the present invention, a stacked capacitor 150 for a DRAM memory 152 is provided. Prior art stacked capacitors typically provide a capacitance between lower electrode 18 (FIG. 1) and upper electrode 16 (FIG. 1) of between about 30 fF and about 300 fF per square micron of electrode area. The present invention significantly increases capacitance between about 20% to about 70% higher for a same thickness of BSTO. For example, 50 fF to about 500 fF per square micron of electrode area is achieved by the invention. Greater improvements in capacitance are contemplated by optimizing both the nucleation step and deposition step. It is to be understood that the nucleation layer need not be the same material as the dielectric layer deposited thereon. The nucleation layer or the dielectric layer may include the materials listed herein or include other materials.

Although the present invention has been described in terms of BSTO, other high dielectric constant materials may be employed. For example, PZT, PLZT, $TiO_2$, BTO, STO, BZTO, SBT, metal oxides and other perovskite dielectrics may be employed. The temperatures and duration of nucleation may be adjusted according to the materials used, the surface of nucleation and the other parameters described above.

Having described preferred embodiments for high dielectric constant material deposition to achieve high capacitance (which are intended to be illustrative and not limiting), it is noted that modifications and variations can be made by persons skilled in the art in light of the above teachings. It is therefore to be understood that changes may be made in the particular embodiments of the invention disclosed. which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming a capacitor dielectric layer, comprising the steps of:
    forming a first capacitor electrode;
    exposing a surface of the first capacitor electrode to a first dielectric material in gaseous form at a first temperature;
    forming nuclei of the first dielectric material on the surface of the first capacitor electrode; and
    depositing a layer of a second dielectric material on the surface by employing the nuclei as seeds for layer growth wherein the depositing is performed at a second temperature which is greater than the first temperature.

2. The method as recited in claim 1, wherein the first dielectric material includes one of a metal oxide and a metal titanate.

3. The method as recited in claim 1, wherein the first temperature is less than about 500 degrees Celsius.

4. The method as recited in claim 1, wherein the second temperature is greater than about 550 degrees Celsius.

5. The method as recited in claim 1, wherein the step of forming nuclei of the first dielectric material includes exposing the surface to the first dielectric material for between about 2 to about 30 seconds.

6. The method as recited in claim 1, further comprising the step of forming a second capacitor electrode over the second dielectric layer to form a capacitor.

7. The method as recited in claim 6, wherein the capacitor provides 50 fF to about 500 fF per square micron of electrode area.

8. The method as recited in claim 1, wherein the first dielectric material and the second dielectric material are the same.

9. The method as recited in claim 8, wherein the first dielectric material and the second dielectric material include barium strontium titanium oxide.

10. The method as recited in claim 1, further comprising the step of preparing the first capacitor electrode by etching a surface of the first capacitor electrode.

11. The method as recited in claim 1, wherein the second dielectric material includes one of a metal oxide and a metal titanate.

12. The method as recited in claim 1, wherein the first dielectric material includes a first composition and the second dielectric material includes a second composition, wherein the first composition is different from the second composition.

13. A method for forming a stacked capacitor for a semiconductor memory device, comprising the steps of:
    forming a first capacitor electrode;
    exposing a surface of the first capacitor electrode to barium strontium titanium oxide (BSTO) in gaseous form at a first temperature;
    forming nuclei of the BSTO on the surface of the first capacitor electrode by adjusting at least one of gas composition, flow rate and pressure of the BSTO to provide a grain size and orientation of the nuclei; and
    depositing a dielectric layer on the surface by employing the nuclei as seeds for layer growth wherein the depositing is performed at a second temperature which is greater than the first temperature.

14. The method as recited in claim 13, wherein the first temperature is between about 350 degrees and about 500 degrees Celsius.

15. The method as recited in claim 13, wherein the second temperature is greater than about 550 degrees Celsius.

16. The method as recited in claim 15, wherein the step of forming nuclei of the BSTO includes exposing the surface to the BSTO for less than about 100 seconds.

17. The method as recited in claim 13, further comprising the step of forming a second capacitor electrode over the dielectric layer to form a capacitor.

18. The method as recited in claim 13, wherein the capacitor provides 50 fF to about 500 fF per square micron of electrode area.

19. The method as recited in claim 13, wherein the dielectric layer includes one of a metal oxide and a metal titanate.

20. The method as recited in claim 13, further comprising the step of annealing the dielectric layer.

21. The method as recited in claim 13, wherein the first dielectric material includes a first composition and the second dielectric material includes a second composition, wherein the first composition is different from the second composition.

22. A method for forming a dielectric layer, comprising the steps of:
    exposing a surface to a first dielectric material in gaseous form at a first temperature;
    forming nuclei of the first dielectric material on the surface; and
    depositing a layer of a second dielectric material on the surface by employing the nuclei as seeds for layer growth wherein the depositing is performed at a second temperature which is greater than the first temperature.

23. The method as recited in claim 22, wherein the first dielectric material includes one of a metal oxide and a metal titanate.

24. The method as recited in claim 22, wherein the first temperature is less than about 500 degrees Celsius.

25. The method as recited in claim 22, wherein the second temperature is between greater than about 550 degrees Celsius.

26. The method as recited in claim 22, wherein the step of forming nuclei of the first dielectric material includes exposing the surface to the first dielectric material for between about 2 to about 30 seconds.

27. The method as recited in claim 22, wherein the first dielectric material and the second dielectric material are the same.

28. The method as recited in claim 27, wherein the first dielectric material and the second dielectric material include barium strontium titanium oxide.

29. The method as recited in claim 27, further comprising the step of preparing the surface by etching.

30. The method as recited in claim 22, wherein the second dielectric material includes one of a metal oxide and a metal titanate.

31. The method as recited in claim 22, wherein the first dielectric material includes a first composition and the second dielectric material includes a second composition, wherein the first composition is different from the second composition.

* * * * *